(12) United States Patent
Gerwig et al.

(10) Patent No.: US 6,694,344 B1
(45) Date of Patent: Feb. 17, 2004

(54) EXAMINATION OF RESIDUES OF DATA-CONVERSIONS

(75) Inventors: Guenter Gerwig, Simmozheim (DE); Juergen Haess, Schoenaich (DE); Michael Kroener, Altdorf (DE); Erwin Pfeffer, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/436,851

(22) Filed: Nov. 9, 1999

(30) Foreign Application Priority Data

Nov. 10, 1998 (DE) .......................................... 198 51 690

(51) Int. Cl.$^7$ ................................................ G06F 11/00
(52) U.S. Cl. ....................................... 708/532; 714/808
(58) Field of Search ........................... 708/532; 714/808, 714/803

(56) References Cited

U.S. PATENT DOCUMENTS

| | | | | |
|---|---|---|---|---|
| 2,919,854 A | * | 1/1960 | Singman | 708/532 |
| 3,124,783 A | * | 3/1964 | Adams | 714/808 |
| 3,624,373 A | * | 11/1971 | Birchall | 708/532 |
| 3,814,923 A | * | 6/1974 | Wang | 708/532 |
| 3,816,728 A | * | 6/1974 | Chen et al. | 708/532 |

\* cited by examiner

*Primary Examiner*—David H. Malzahn
(74) *Attorney, Agent, or Firm*—Gail H. Zarick; Anne V. Dougherty

(57) ABSTRACT

A process is provided for monitoring the conversion of numerical values from a first to a second format, where before and after the conversion, the modulo residue of the corresponding numerical value is calculated and compared with the corresponding residue after the conversion. In this way it is possible to effect error-free monitoring of such a conversion, especially of computer data, without great hardware expenditure.

14 Claims, 1 Drawing Sheet

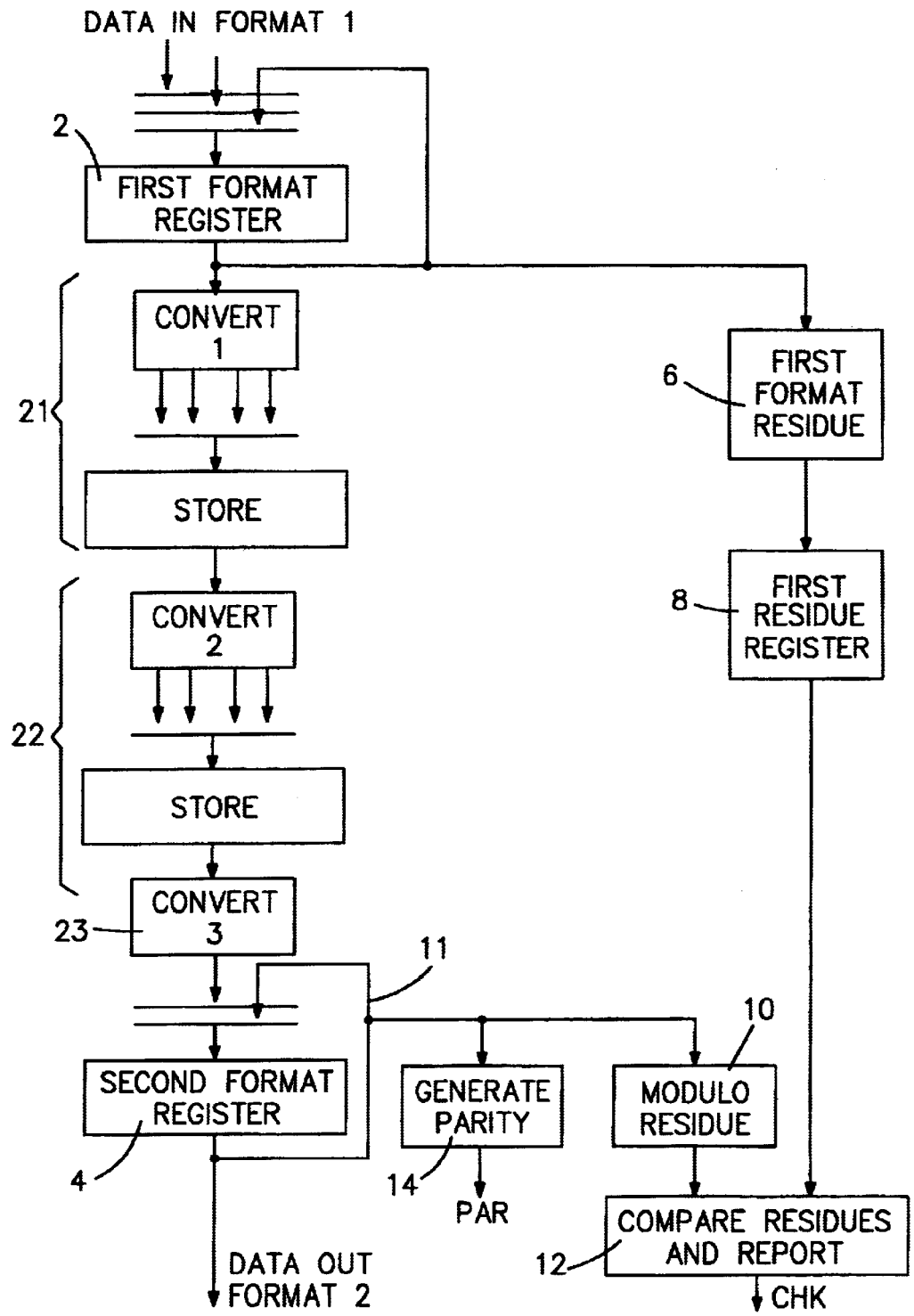

EXAMINATION OF RESIDUES OF DATA-CONVERSIONS

FIELD OF THE INVENTION

The present invention relates in general to the monitoring of computer data. In particular, it relates to such monitoring in the conversion of data into other formats.

BACKGROUND OF THE INVENTION

Computer systems are largely constructed so that they comprise a large number of hardware registers, which serve as data sources or data targets. These registers can contain interrupts, addresses, control bits, status information, numerical data and the like for different parts of the computer. Numerical data are represented by sequences of binary digits or bits. The data bits in these binary bit sequences are in general divided into groups, each of 8 bits, each of these groups being known as a "byte". In order to be able recognise the appearance of faulty data, a so-called "parity check bit" is assigned to each of these bytes at various stages of the passage of the data through the computer. In the case of the application of so-called "odd parity checking" the value of the parity bits is set so that the total 9-bit combination of the 8 data bits and the parity check bit produces an odd number of binary bits of the value 1, while with "even parity checking", an even number results. Parity checks are carried out at different locations of the computer by determining the corresponding number of bits of the value 1 in each 9-bit combination. If "odd parity checking" is used and an even number of bits of value 1 is detected, it is then clear that this data segment contains an error. This is also valid if "even parity checking" is used and an odd number of bits of the value 1 is detected.

Such parity checking can also be employed in cases in which computer data is to be converted from one format to another, for example, from a decimal to a binary format or vice versa. With complicated conversions of computer data it is often very difficult to monitor the correct execution of this conversion or the functionality of the conversion logic during operation, since the monitoring logic which is conventionally used for computer data with the aid of parity bits and parity checkers in many cases prevents the data conversion, since the cost of parity calculation and checking for this would be unacceptably high and also prone to error.

One common method for monitoring is therefore in many cases to double the whole of the monitoring logic with a subsequent comparison of the results. Although such a solution is relatively simple to implement in terms of hardware, it naturally necessitates an immense hardware cost. Consequently, this "overhead" of about 110% generally cannot be tolerated; usually only 20 to 30% is allowed as an "overhead" for checking, for example, in very large systems.

It is therefore an object of the present invention to provide a method with the aid of which it is possible in a simple manner to monitor the conversion of computer data from one format to another format.

It is a further object of the present invention to provide such a method which is effective without a doubling of the corresponding hardware.

SUMMARY OF THE INVENTION

This and other objects are achieved by the present invention wherein the modulo residues (or remainders) of the numerical values in a first format are calculated prior to converting the numerical values into a second format. The residue values are stored while the numerical values are converted from the first format into a plurality of numerical values in a second format. Thereafter, the modulo residues are calculated for each of the plurality of numerical values in the second format. The first and second modulo residues are compared for each numerical value. If the first and second modulo residues are the same, then it is concluded that the conversion was error-free.

BRIEF DESCRIPTION OF THE FIGURE

The invention is hereinafter described in more detail with the aid of the single drawing. This drawing shows the course of the different steps in the monitoring method in accordance with the invention.

DETAILED DESCRIPTION OF THE INVENTION

With the aid of the monitoring method in accordance with the invention it is possible to test even complex instructions for correct function in a simple manner, without having to accept extra expenditure in terms of the hardware to be used. Another advantage resides in the fact that processes which extend over several clock cycles, no longer require checking after each cycle but only have to be compared at the start and end of the entire process.

The present invention is based on the mathematical fact that the numerical values before and after a format conversion show the same residue remaining. The concept "modulo n" denotes an integer division by a number "n" with a not-further-divisible remainder (the residue). Thus, for example, through integer division by the number 7 <"modulo 7"> the division-remainders (residues) may be 0, 1, 2, 3, 4, 5 and 6. The integer division remainder of a number with the same divisor remains exactly the same regardless of the number format with which a number is represented before or after a conversion.

If advantage is taken of this fact, it is therefore sufficient to determine and compare the modulo residue of the numerical value in each case before and after a format-conversion. If both numerical values are identical, there is no error, if not, an error has occurred.

This procedure is clearly less costly than doubling the entire logic and still carrying out the corresponding comparison. It is, moreover, simpler to carry out a check by the method in accordance with the invention, than it is to perform a complicated parity calculation which is considerably more difficult to implement. Furthermore the present monitoring procedure is also naturally less subject to error.

In order to keep the quality of the monitoring high enough in terms of, for example, the development objectives and/or the test/quality requirements, the modulus selected should not be too low. Suitable moduli are modulo 7, which recognises errors with the likelihood 6/7 (this allows the residues 0,1,2,3,4,5 and 6 —after 7 it repeats, i.e., 6 of 7 possible residues would be incorrect and only one correct) and modulo 15, which can be easily constructed from modulo 3 and modulo 5. It will be clear to the skilled person, however, that the present invention is not limited to these moduli.

The ensuing description refers to conversion of computer data from a first format (for example decimal) to a second format (for example, binary), as is usually done in the conversion of input and output data from and to interfaces between man and machine (MMI—Man/Machine Interface) for example, to printers.

For the internal treatment and storage of data, it is advantageous for computer systems, to have the data available in a compact, easy-to-process binary format. This on the one hand requires less storage space and smaller numerical registers and, on the other hand, allows simple calculation, for example, in the case of additions where carries can be easily propagated. For human users, however, it is more important to represent numbers legibly, for which purpose the decimal system is used almost exclusively, because a binary numerical value of, for example, "1011001" does not convey as much to the reader as its decimal representation, "89". Accordingly, computer data, on the way to many human/machine interfaces, are converted to the decimal format, so that, for example, such data can be represented legibly on printers or screens.

In the drawing, the incoming data <DATA-in>, which are input in the first format (for example, decimal) and with a data width of, for example, 64 bits, are first recorded in a register 2. Now the actual conversion begins, by way of a multi-stage addition process, to the second format (for example, binary), which is made available in another register 4. Such conversion mechanisms are known to the expert and so will not be discussed here in detail. The complexity of the conversion and the fast clock rate of the big machines which are common today require the division of the conversion into three parts 21, 22, 23, which in the present example (other cycles are also possible, however) each require one clock cycle. Consequently, three clock cycles pass before the result is available in register 4. In accordance with the present invention, however, not every one of these part steps now has to be monitored for its correct handling but it is sufficient to form the modulo residue 6 of the initial value (which is in register 2) and store it in a register 8. For a modulo 7 for example, only an additional 7 bits are required. Finally, this value is compared with the modulo residue 10 of the result of the conversion, which is generated after the conversion from register 4. In the case of an error, an error message 12 is then received, i.e., a recognised error is reported to the processor control. If necessary, if special events cause a time-lag, data can be held and fed back through the connection 11 for another application into the register 4.

For further standard processing of the data, a parity 14 can now also be generated again and passed on. The amended data (DATA-out) can now be reprocessed. In this way it is possible, without hardware-intensive duplication of the logic, to effect error checking of the conversion, which is much less prone to error and can be carried out without great expenditure.

What is claimed is:

1. A method for the monitoring of the parallel conversion of a plurality of numerical values from a plurality of first data format values to a plurality of second data format values comprising the steps of:

calculating a first modulo residue for each of said first data format values in parallel wherein the residue comprises the not-further-divisible remainder after integer division of the first data format value by a number n;

converting each of said first data format values to second data format values;

calculating a second modulo residue for each of said second data format values in parallel wherein the residue comprises the not-further-divisible remainder after integer division of the second data format value by the number n; and comparing the first modulo residue to the second modulo residue for each of said plurality of numerical values to verify that the converting is error free.

2. The method of claim 1 further comprising the step of reporting an error when said comparing determines that the first modulo residue and the second modulo residue for one of said plurality of numerical values are not the same.

3. The method of claim 1 wherein the numerical values comprise computer data.

4. The method of claim 3 wherein the first data format comprises a binary format and the second data format comprises a decimal format.

5. The method of claim 4 wherein a high modulo value comprising at least modulo 7 is used.

6. The method of claim 3 wherein a high modulo value comprising at least modulo 7 is used.

7. The method of claim 1 wherein the first data format comprises a binary format and the second data format comprises a decimal format.

8. The method of claim 7 wherein a high modulo value comprising at least modulo 7 is used.

9. The method of claim 1 wherein a high modulo value comprising at least modulo 7 is used.

10. A system for providing error-free conversion of a plurality of numerical values from a plurality of first data format values to a plurality of second data format values comprising:

a plurality of parallel processor components for calculating a first modulo residue for each of said first data format values and a second modulo residue for each of said plurality of second data format values wherein the first and second modulo residues comprise the not-further-divisible remainders after integer division of each of the first and the second data format values by a number n;

at least one conversion component for converting each of said first data format values to second data format values; and at least one comparator for comparing the first modulo residue to the second modulo residue for each of said plurality of numerical values to verify that the converting is error free.

11. The system of claim 10 further comprising at least one storage location for storing at least one modulo residue.

12. The system of claim 11 further comprising reporting means for reporting an error when said comparator component determines that said first modulo residue and said second modulo residue for one of said plurality of numerical values are not the same.

13. The system of claim 10 further comprising reporting means for reporting an error when said comparator component determines that said first modulo residue and said second modulo residue for one of said plurality of numerical values are not the same.

14. A program storage device readable by machine, tangibly embodying a program of instructions executable by the machine, for causing the machine to perform method steps for the monitoring the parallel conversion of a plurality of numerical values from a plurality of first data format values to a plurality of second data format values, said method steps comprising:

calculating a first modulo residue for each of said first data format values in parallel wherein the residue comprises the not-further-divisible remainder after integer division of the first data format value by a number n;

converting each of said first data format values to second data format values;

calculating a second modulo residue for each of said second format values in parallel wherein the residue comprises the not-further-divisible remainder after integer division of the second format value by a number n; and comparing the first modulo residue to the second modulo residue for each of said plurality of numerical values to verify that the converting is error free.

* * * * *